US011721973B2

United States Patent
Lee

(10) Patent No.: US 11,721,973 B2
(45) Date of Patent: Aug. 8, 2023

(54) OVERVOLTAGE PROTECTION CIRCUIT

(71) Applicant: Global Mixed-mode Technology Inc., Hsin-Chu (TW)

(72) Inventor: Rong-Chin Lee, Pingtung County (TW)

(73) Assignee: Global Mixed-mode Technology Inc., Hsin-Chu (TW)

( * ) Notice: Subject to any disclaimer, the term of this patent is extended or adjusted under 35 U.S.C. 154(b) by 260 days.

(21) Appl. No.: 16/992,094

(22) Filed: Aug. 12, 2020

(65) Prior Publication Data

US 2022/0052520 A1   Feb. 17, 2022

(51) Int. Cl.
| H02H 9/04 | (2006.01) |
| G01R 19/165 | (2006.01) |
| H03K 17/0812 | (2006.01) |
| H03K 17/76 | (2006.01) |
| H03K 17/687 | (2006.01) |
| H03K 5/24 | (2006.01) |

(52) U.S. Cl.
CPC ....... *H02H 9/042* (2013.01); *G01R 19/16528* (2013.01); *H02H 9/044* (2013.01); *H03K 5/24* (2013.01); *H03K 17/08122* (2013.01); *H03K 17/6871* (2013.01); *H03K 17/76* (2013.01)

(58) Field of Classification Search
None
See application file for complete search history.

(56) References Cited

U.S. PATENT DOCUMENTS

| 10,784,857 | B1 * | 9/2020 | Li | H03K 17/168 |
| 2004/0090807 | A1 | 5/2004 | Youm | |
| 2004/0136133 | A1 * | 7/2004 | Youm | H02H 9/001 |
| | | | | 361/91.1 |
| 2009/0237854 | A1 * | 9/2009 | Mok | H02M 3/156 |
| | | | | 361/111 |
| 2014/0285165 | A1 * | 9/2014 | Wang | G05F 1/575 |
| | | | | 323/274 |
| 2017/0337886 | A1 * | 11/2017 | Luo | G09G 3/36 |

FOREIGN PATENT DOCUMENTS

| CN | 106655109 A | 5/2017 |
| TW | 349294 | 1/1999 |
| TW | 202002479 A | 1/2020 |

* cited by examiner

*Primary Examiner* — Daniel C Puentes
(74) *Attorney, Agent, or Firm* — Winston Hsu

(57) ABSTRACT

An overvoltage protection circuit which can be applied to a motor controller is provided. The overvoltage protection circuit is coupled to an input terminal for receiving an input voltage. The overvoltage protection circuit comprises a switch circuit, a controller, and a comparing unit. When the input voltage is greater than a first voltage, a discharging mechanism is forced to start so as to suppress a voltage spike. When the input voltage is less than a second voltage, the discharging mechanism is closed so as to operate normally.

15 Claims, 4 Drawing Sheets

OVERVOLTAGE PROTECTION CIRCUIT

BACKGROUND OF THE INVENTION

1. Field of the Invention

The present invention relates to an overvoltage protection circuit, and more particularly, to an overvoltage protection circuit which can be applied to a motor controller.

2. Description of the Prior Art

FIG. 1 is a circuit diagram showing a conventional hot-plug system 10. The power supply 110 provides a supply voltage Vps so that the motor controller 100 has an input voltage Vcc. When the switch SW is turned on at time T1, the line resistor R, the line inductor L and the capacitor C result in an oscillation, such that the input voltage Vcc is too large. FIG. 2 is a timing chart showing the related signals of FIG. 1. As shown in FIG. 2, the input voltage Vcc will be too large after time T1. Thus, the device may be damaged if there is no protection circuit. Generally, a Zener diode coupled between the switch SW and the motor controller 100 may be used to clamp the voltage spike. However, the cost will be increased by such method.

Thus, what is needed is an overvoltage protection circuit which is capable of protecting the device from damage.

SUMMARY OF THE INVENTION

According to the present invention, an overvoltage protection circuit which can be applied to a motor controller is provided. The overvoltage protection circuit is coupled to an input terminal for receiving an input voltage. The overvoltage protection circuit comprises a switch circuit, a controller, and a comparing unit. When the input voltage is greater than a first voltage, a discharging mechanism is forced to start so as to suppress a voltage spike. When the input voltage is less than a second voltage, the discharging mechanism is closed so as to operate normally.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION

Preferred embodiments according to the present invention will be described in detail with reference to the drawings.

Figure 1:
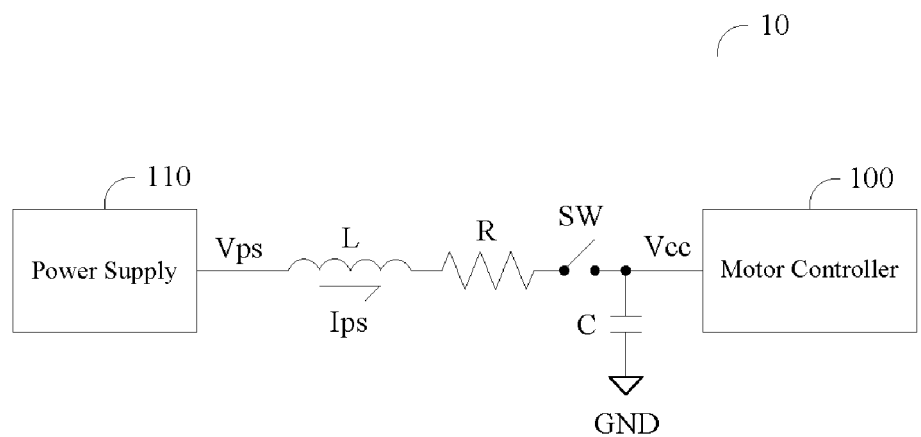
FIG. 1 is a circuit diagram showing a conventional hot-plug system.
Figure 2:
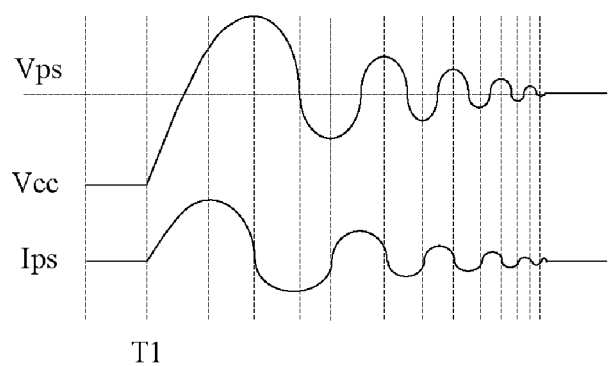
FIG. 2 is a timing chart showing the related signals of FIG. 1.
Figure 3:
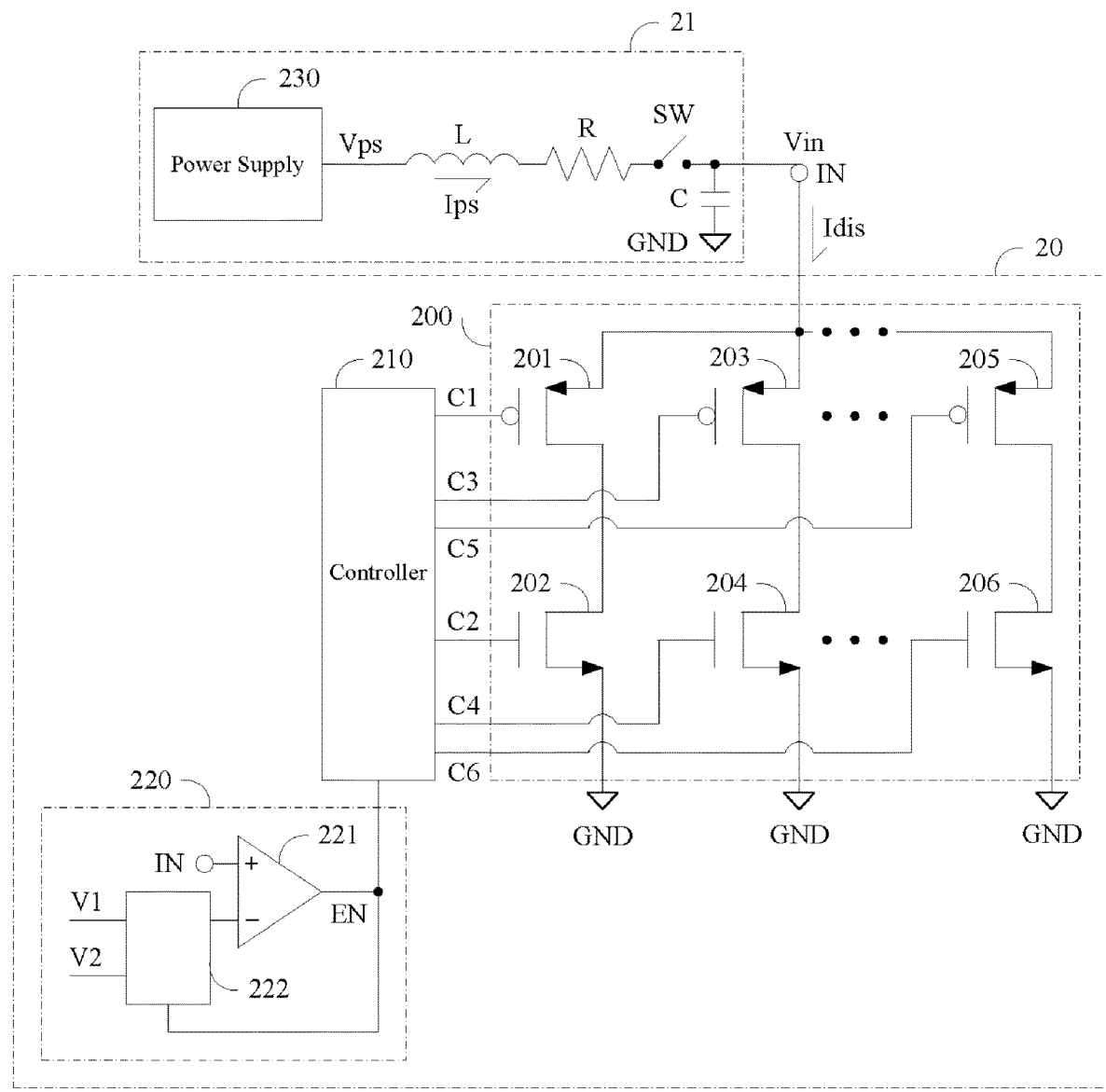
FIG. 3 is a circuit diagram showing an overvoltage protection circuit and a peripheral circuit according to one embodiment of the present invention.

FIG. 3 is a circuit diagram showing an overvoltage protection circuit 20 and a peripheral circuit 21 according to one embodiment of the present invention. The peripheral circuit 21 comprises a power supply 230 and a switch SW so as to provide a supply voltage Vps, an input voltage Vin, and a supply current Ips. The overvoltage protection circuit 20 is coupled to an input terminal IN for receiving the input voltage Vin. The overvoltage protection circuit 20 comprises a switch circuit 200, a controller 210, and a comparing unit 220.

The switch circuit 200 includes a first transistor 201, a second transistor 202, a third transistor 203, a fourth transistor 204, a fifth transistor 205, and a sixth transistor 206. The controller 210 generates a first control signal C1, a second control signal C2, a third control signal C3, a fourth control signal C4, a fifth control signal C5, and a sixth control signal C6 so as to respectively control the ON/OFF states of the first transistor 201, the second transistor 202, the third transistor 203, the fourth transistor 204, the fifth transistor 205, and the sixth transistor 206. The first transistor 201 is coupled to the input terminal IN and the second transistor 202. The second transistor 202 is coupled to a terminal GND. The third transistor 203 is coupled to the input terminal IN and the fourth transistor 204. The fourth transistor 204 is coupled to the terminal GND. The fifth transistor 205 is coupled to the input terminal IN and the sixth transistor 206. The sixth transistor 206 is coupled to the terminal GND. The first transistor 201, the second transistor 202, the third transistor 203, the fourth transistor 204, the fifth transistor 205, and the sixth transistor 206 may be respectively a p-type MOSFET or an n-type MOSFET. As shown in FIG. 3, each of the first transistor 201, the third transistor 203, and the fifth transistor 205 may be a p-type MOSFET. Each of the second transistor 202, the fourth transistor 204, and the sixth transistor 206 may be an n-type MOSFET.

The comparing unit 220 is coupled to the input terminal IN and receives a first signal V1 and a second signal V2, so as to generate an enabling signal EN to the controller 210. The first signal V1 has a first voltage Voh and the second signal V2 has a second voltage Vol, where the first voltage Voh is greater than the second voltage Vol. For example, the comparing unit 220 may comprise a comparator 221 and a multiplexer 222. The comparator 221 is coupled to the input terminal IN and an output terminal of the multiplexer 222, so as to generate the enabling signal EN. The multiplexer 222 receives the first signal V1, the second signal V2, and the enabling signal EN for generating an output signal to the comparator 221. When the enabling signal is at a low level L, the multiplexer 222 selects the first signal V1 and the first signal V1 is coupled to the comparator 221. When the enabling signal is at a high level H, the multiplexer 222 selects the second signal V2 and the second signal V2 is coupled to the comparator 221.

Figure 4:
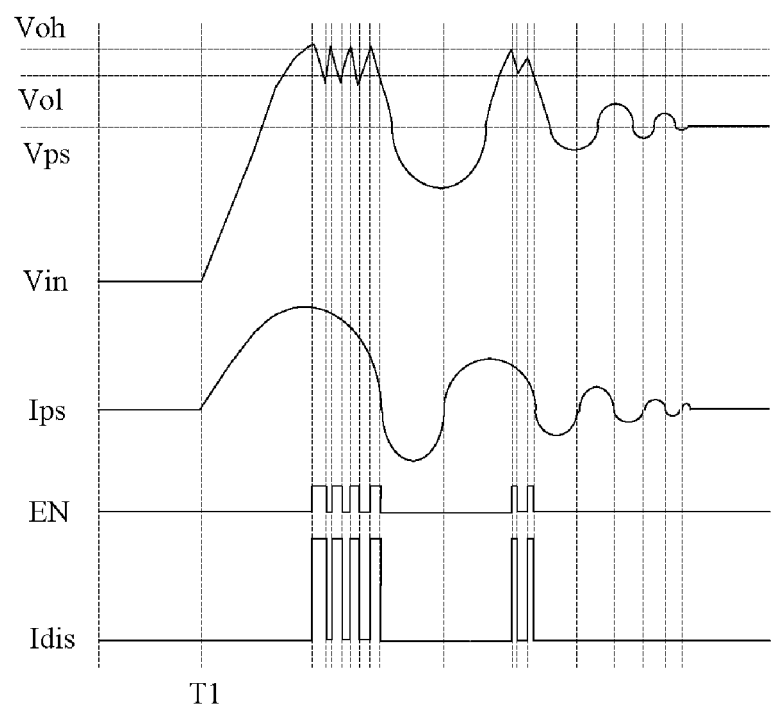
FIG. 4 is a timing chart showing the related signals of FIG. 3 according to one embodiment of the present invention.

FIG. 4 is a timing chart showing the related signals of FIG. 3 according to one embodiment of the present invention. Referring to FIG. 3 and FIG. 4, when the switch SW is turned on at time T1, the input voltage Vin will be increased gradually. When the input voltage Vin is greater than the first voltage Voh, a discharging mechanism is forced to start to suppress a voltage spike. At this moment the enabling signal is at the high level H, so as to inform the controller 210 to direct the discharging current Idis flowing to the input terminal IN to the terminal GND. The controller 210 may simultaneously or non-simultaneously turn on the first transistor 201 and the second transistor 202 for generating one discharging path. The controller 210 may simultaneously or non-simultaneously turn on the first transistor 201, the second transistor 202, the third transistor 203, and the fourth transistor 204 for generating two discharging paths. Also, the controller 210 may simultaneously or non-simultaneously turn on the first transistor 201, the second transistor 202, the third transistor 203, the fourth transistor 204, the fifth transistor 205, and the sixth transistor 206 for generating three discharging paths. When the input voltage Vin is less than the second voltage Vol, the discharging mechanism is closed. At this moment the enabling signal EN is at the low level L, so as to inform the controller 210 to operate normally and close the corresponding discharging path. As shown in FIG. 4, the waveform of the input voltage Vin forms a sawtooth pattern and the input voltage Vin oscillates between the first voltage Voh and the second voltage Vol, so as to achieve the purpose of the overvoltage protection.

The overvoltage protection circuit 20 of the present invention can be applied to a hot-plug system for suppressing the voltage spike of the input voltage Vin. Moreover, the overvoltage protection circuit 20 may be configured to suppress the voltage spike which is generated when a motor brakes or changes a rotation direction. The overvoltage protection circuit 20 can be applied to a single-phase or polyphase motor. Also, the overvoltage protection circuit 20 can be applied to an inductive actuator, such as a brushless motor, a DC motor, a voice coil motor, or an electromagnetic actuator. Since it is needless to use an external device (e.g., a Zener diode), the manufacturing cost can be reduced.

While the present invention has been described by the preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overvoltage protection circuit configured to suppress a voltage spike, wherein the overvoltage protection circuit comprises:
  a switch circuit, coupled directly to an input terminal with respect to the switch circuit, so as to receive an input voltage with respect to the switch circuit, wherein the switch circuit comprises a first transistor, a second transistor, a third transistor and a fourth transistor, the first transistor is coupled to the input terminal, the second transistor is coupled to the first transistor and a first terminal, the third transistor is coupled to the input terminal, and the fourth transistor is coupled to the third transistor and the first terminal;
  a controller, coupled to the switch circuit for controlling the switch circuit, wherein the controller generates a first control signal, a second control signal, a third control signal, and a fourth control signal to respectively control the first transistor, the second transistor, the third transistor, and the fourth transistor; and
  a comparing unit, coupled to the input terminal, wherein the comparing unit receives a first signal and a second signal, the comparing unit is configured to compare the input voltage with a first voltage and compare the input voltage with a second voltage, so as to generate an enabling signal to the controller, and the first voltage is greater than the second voltage.

2. The overvoltage protection circuit of claim 1, wherein the first signal has the first voltage and the second signal has the second voltage.

3. The overvoltage protection circuit of claim 2, wherein the comparing unit comprises:
  a comparator; and
  a multiplexer, configured to receive the first signal, the second signal, and the enabling signal for generating an output signal to the comparator.

4. The overvoltage protection circuit of claim 3, wherein the comparator is coupled to the input terminal for generating the enabling signal.

5. The overvoltage protection circuit of claim 4, wherein when the enabling signal is a low level, the multiplexer selects the first signal and the first signal is coupled to the comparator.

6. The overvoltage protection circuit of claim 5, wherein when the enabling signal is a high level, the multiplexer selects the second signal and the second signal is coupled to the comparator.

7. The overvoltage protection circuit of claim 1, wherein the switch circuit further comprises:
  a fifth transistor, coupled to the input terminal; and
  a sixth transistor, coupled to the fifth transistor and the first terminal.

8. The overvoltage protection circuit of claim 7, wherein the controller further generates a fifth control signal and a sixth control signal to respectively control the fifth transistor and the sixth transistor.

9. The overvoltage protection circuit of claim 8, wherein each of the first transistor, the third transistor, and the fifth transistor is a p-type MOSFET, and each of the second transistor, the fourth transistor, and the sixth transistor is an n-type MOSFET.

10. The overvoltage protection circuit of claim 1, wherein when the input voltage is greater than the first voltage, a discharging mechanism is started to suppress the voltage spike.

11. The overvoltage protection circuit of claim 10, wherein when the input voltage is less than the second voltage, the discharging mechanism is closed to operate normally.

12. The overvoltage protection circuit of claim 1, wherein a waveform of the input voltage forms a sawtooth pattern and the input voltage oscillates between the first voltage and the second voltage.

13. The overvoltage protection circuit of claim 1, wherein the overvoltage protection circuit can be applied to a hot-plug system for suppressing the voltage spike.

14. The overvoltage protection circuit of claim 1, wherein the overvoltage protection circuit is configured to suppress the voltage spike which is generated when a motor brakes or changes a rotation direction.

15. The overvoltage protection circuit of claim 1, wherein the overvoltage protection circuit can be applied to a single-phase or polyphase motor.

* * * * *